United States Patent
Leach

(10) Patent No.: US 6,214,522 B1
(45) Date of Patent: Apr. 10, 2001

(54) PHOTOSENSITIVE RESIN COMPOSITION USEFUL IN FABRICATING PRINTING PLATES

(75) Inventor: Douglas Leach, Hockessin, DE (US)

(73) Assignee: MacDermid, Incorporated, Waterbury, CT (US)

( * ) Notice: Subject to any disclaimer, the term of this patent is extended or adjusted under 35 U.S.C. 154(b) by 0 days.

(21) Appl. No.: 09/143,427

(22) Filed: Aug. 28, 1998

(51) Int. Cl.⁷ ..................................................... G03F 7/028
(52) U.S. Cl. ........................... 430/284.1; 522/96; 522/97
(58) Field of Search ........................... 430/284.1; 522/96, 522/97

(56) References Cited

U.S. PATENT DOCUMENTS

| 3,850,770 | * | 11/1974 | Juna et al. | 204/159.19 |
| 3,960,572 | * | 6/1976 | Ibata et al. | 96/115 P |
| 4,006,024 | * | 2/1977 | Ibata et al. | 96/115 R |
| 4,057,431 | * | 11/1977 | Finelli et al. | 96/115 R |
| 5,185,420 | * | 2/1993 | Smith et al. | 528/61 |
| 5,288,571 | * | 2/1994 | Nakamura et al. | 430/18 |
| 5,364,741 | * | 11/1994 | Huynh-Tran et al. | 430/300 |
| 5,527,835 | * | 6/1996 | Shustack | 522/42 |

OTHER PUBLICATIONS

Seneker, S.D. et al, "New Polyether polyols for aqueous Polyurethane Dispersions", Modern Paint and Coatings, May 1997 pp. 27–30, 34, 36.*

* cited by examiner

*Primary Examiner*—Cynthia Hamilton
(74) *Attorney, Agent, or Firm*—Carmody & Torrance LLP

(57) ABSTRACT

A photosensitive resin, process for its use, and printing plates formed thereby are disclosed wherein the photosensitive resin comprises (i) a polyurethane prepolymer which is the reaction product of at least one polyether diol having olefin unsaturation equal to or less than 0.01 meq/gm, at least one diisocyanate, and a hydroxy-functionalized (meth) acrylate, (ii) at least one monomer and (iii) at least one photoinitiator.

4 Claims, No Drawings

PHOTOSENSITIVE RESIN COMPOSITION
USEFUL IN FABRICATING PRINTING
PLATES

FIELD OF THE INVENTION

The present invention relates to a photosensitive resin composition, to printing plates made therefrom, and to a method of flexographic printing therewith.

BACKGROUND OF THE INVENTION

In flexographic printing, also known as relief printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

The demands placed on flexographic printing plates are great. For instance, a flexographic printing plate must have sufficient flexibility (a mechanical property) to wrap around a printing cylinder, yet be strong enough to withstand the rigors experienced during typical printing processes. Further, the printing plate should possess a low hardness or softness to facilitate ink transfer during printing.

It is also required that the printing plate have a relief image that has a chemical resistance against the aqueous-based ink or alcohol-based ink which is usually used in flexographic printing. It is further desired that the physical and printing properties of the printing plate are stable and do not change during printing or storage.

Photopolymerizable resin compositions generally comprise an elastomeric binder, herein sometimes referred to as a prepolymer, at least one monomer and a photoinitiator. To prepare the plates, there is generally formed a photopolymerizable layer interposed between a support and one or more cover sheets that may include slip and release films to protect the photosensitive surface. Upon imagewise exposure to actinic radiation, polymerization, and hence, insolubilization of the photopolymerizable layer occurs in the exposed areas. Treatment with a suitable developer removes the unexposed areas of the photopolymerizable layer leaving a printing relief which can be used for flexographic printing.

U.S. Pat. No. 3,850,770 discloses photopolymerizable resin compositions containing methacrylated polyether urethanes based on low molecular weight polyethylene oxides or polypropylene oxides. The patent discloses using glycols of molecular weight up to 200 Da (daltons) to produce polyurethane resins of molecular weight up to 2400 Da. Having a molecular weight higher than this is said to result in too low a hardness and too high a swell to be suitable.

U.S. Pat. No. 4,057,431 discloses photopolymerizable polyurethanes prepared with various ethylene oxide/propylene oxide copolymers. Hardness results for the samples that were provided were 95 Shore A or greater, which is generally too hard for printing on most substrates in flexography.

Methacrylate- or acrylate-terminated polyurethane oligomers diluted with various (meth)acrylate monomers and a photoinitiator is described in U.S. Pat. Nos. 4,006,024 and 3,960,572. The polyurethane oligomers of the '024 and '572 patents are derived from a diisocyanate such as toluene diisocyanate (TDI) and various mixtures polyester and polyether polyols such as polypropylene glycol adipate or polyethylene oxide/propylene oxide copolymer, and a mixture thereof. The resultant printing plate can be used for printing on a wide variety of substrates, including corrugated board, various types of paper bags, and various types of cardboard packaging. However, the photopolymer resins described in the '024 and '572 patents are not stable upon storage due to degradation resulting from hydrolysis of the polyester polyol.

In order to maintain high quality, clear printing during a run it is highly desirable that a printing plate not pick up deposits of paper fibers and dried ink which would fill in reverse areas of the plate and deposit on and at the edges of the printing areas of the plate. When plates become dirty quickly during printing, the printing press must be shut down periodically during the run to clean the plates, resulting in a loss of productivity. One of the most important properties required for a printing plate for printing on corrugated boards is a high rebound or impact resilience.

It is well known in the art that polyalkylene oxide polyether polyols are polymerized through base catalysis. For example, polypropylene oxide diols are prepared by the base catalyzed propoxylation of a difunctional initiator such as propylene glycol. During base catalyzed propoxylation, a competing side reaction is the rearrangement of propylene oxide to allyl alcohol to introduce an unsaturated monofunctional species into the reactor. Due to the continual production of allyl alcohol and its subsequent propoxylation, the average functionality of the polyol mixture decreases, and the molecular weight distribution broadens, as the molecular weight of the polypropylene oxide increases. This rearrangement is discussed in "Principles of Polymerization" by G. Odian, John Wiley and Sons, ©1981, pp. 515. Unsaturation is measured in accordance with ASTM method D4671-93 "Polyurethane Raw Materials: Determinations of Unsaturation of Polyols", with the result typically expressed as milliequivalents of olefin per gram of polyether (meq/gm). Typical values for unsaturation in polyether polyols vary from 0.02 meq/gm, to 0.05 meq/gm.

U.S. Pat. No. 5,185,420 discloses thermoplastic polyurethane elastomers based on polyether polyols prepared with double metal cyanide (DMC) catalysts.

U.S. Pat. No. 5,364,741 discloses using polyether diols to produce solid photosensitive resin printing plates containing chain-extended polyurethanes. Ethylene oxide/propylene oxide block copolymers of an A-B-A type structure wherein the A blocks are polyethylene oxide and the B blocks are propylene oxide with the A blocks being 10–30 weight percent of the total are disclosed as being preferred. The unsaturated polyurethanes in this reference are produced by chain extending a diol with an excess of diisocyanate, followed by further chain extension by an alkyldialkanolamine and then lastly endcapping with a hydroxyalkylmethacrylate or acrylate.

OBJECTS OF THE INVENTION

It is an object of the present invention to provide a photosensitive resin which can be used to manufacture a printing plate which is not subject to degradation due to hydrolysis upon storage.

It is a further object of this invention to provide a photosensitive resin which can be used to manufacture a printing plate which exhibits high rebound resilience, tensile strength and elongation while exhibiting a Shore A hardness of between 25 and 60 to allow excellent printing on a wide variety of substrates.

It is a further object of this invention to provide a photosensitive resin which can be developed after exposure using an aqueous detergent to produce a relief printing plate, and which exhibits low swell in water-based printing inks.

SUMMARY OF THE INVENTION

It has now been quite surprisingly discovered that photosensitive resins useful for printing on corrugated board and paper substrates based on polyurethane prepolymers prepared from low unsaturation polyether polyols have uniquely high combinations of tensile strength, rebound resilience and low hardness and produce excellent ink transfer in corrugated printing. The present invention provides a photosensitive resin composition which is useful for preparing printing plates for printing on corrugated boards, comprising: (i) a polyurethane prepolymer; (ii) a monomer having at least one acrylate or methacrylate group; and (iii) a photopolymerization initiator. The urethane prepolymer is the reaction product of a of polyether diol, or a blend of polyether diols, having an unsaturation equal to or less than 0.01 meq/gm, a diisocyanate, and a hydroxy-functionalized (meth)acrylate.

DETAILED DESCRIPTION OF THE INVENTION

The photosensitive resin composition of the invention comprises a polyurethane prepolymer, a monomer or mixture of monomers having at least one (meth)acrylate group, and a photopolymerization initiator. The urethane prepolymer is formed by the reaction of polyetherdiol, or a blend of polyether diols, a molecule having at least two isocyanate groups, preferably a diisocyanate, and a molecule having at least one hydroxyl group and at least one (meth)acrylate group, also known as a hydroxy-functionalized (meth) acrylate wherein said polyether diol or diols are characterized as having a level of terminal olefin unsaturation of less than 0.01 meq/gm, and more preferably less than 0.007 meq/gm. Suitable polyether diols include Acclaim 3201, Acclaim 3205, Acclaim 4220, Acclaim 2200 and Acclaim 2220, available from Arco Chemical of Newtowne Square, Pa. and Poly L255-37 from Olin Corporation of Stamford, Conn. Other polyether diols having similar amounts of terminal olefin unsaturation would be suitable as well. Unsaturation is generally measured in accordance with ASTM method D4671-93 entitled, "Polyurethane Raw Materials: Determinations of Unsaturation of Polyols", with the result typically expressed as milliequivalents of olefin per gram of polyether (meq/gm). Correspondingly, polyether diols with low levels of unsaturation have hydroxy functionality at nearly 2.0 hydroxy groups per molecule. Generally, the polyether diols useful in this invention have hydroxy functionality in excess of 1.97 per molecule. Polyether diols having unsaturations higher than 0.01 meq/gm are wholly unsuitable for use in the present invention, as the resilience of the printing plate formed from liquid photosensitive resins incorporating such polyether diols is generally too low to enable them to print cleanly on corrugated boards or other kraft paper.

Preferred polyether diols are ethylene oxide-propylene oxide co-polymers that meet the low levels of unsaturation specified above. The ethylene oxide-propylene oxide copolymers may be either random copolymers, block copolymers or segmented copolymers. More preferably, they are random copolymers or segmented copolymers. Most preferably, they are segmented ethylene oxide/propylene oxide copolymers, containing a middle segment comprised of a random copolymer of a low amount of ethylene oxide (eg. less than 25%) with propylene oxide, and end segments comprised of random copolymers of propylene oxide and 25% or more ethylene oxide.

It has been observed that ethylene oxide-propylene oxide copolymers having between 10 and 30 weight percent ethylene oxide impart excellent resilience, strength and tear strength to flexographic printing plates. The rebound resilience (measured as Bayshore resilience according to ASTM method D2632) typically observed for printing plates made from the resins of the instant invention are between 40 and 60%. More preferably the Bayshore resilience will be greater than 45%. The Bayshore resilience obtained for printing plates comprising polyether polyols with unsaturations greater than 0.01 meq/gm are typically less than 40%. The presence of at least 10% by weight of ethylene oxide also renders the unexposed areas of the photosensitive resin readily more removable by washing the exposed photopolymer plate with an aqueous solution of detergent.

In order to produce photopolymer resins having a viscosity appropriate for the easy manufacture of flexographic printing plates, and to produce printing plates having the appropriate hardness, tensile strength, elongation, and resilience, it is preferred to use polyether diols having a number average molecular weight from about 500 to about 5000. More preferably, the number average molecular weight of the polyether diol will be above 2,000, and most preferably from about 2500 to about 4500.

The polyurethane prepolymer of the invention is prepared by first reacting the noted polyether diol or diols with a material having at least two isocyanate groups, preferably a diisocyanate. The diisocyanate used to prepare the polyurethane prepolymer of the invention is preferably an aromatic diisocyanate, although an aliphatic diisocyanate can be used just as well. Typical aromatic diisocyanates include methylene diphenyldiisocyanate (a.k.a. diphenylmethane-4,4'-diisocyanate), meta- and para-xylene diisocyanate, toluene-2,4-diisocyanate, toluene-2,6-diisocyanate or mixtures of the latter two isomers (a.k.a. 2,4- and 2,6-toluene diisocyanate), naphthalene-1,5-diisocyanate, phenyl benzyl ether 4,4'-diisocyanate and the like.

Aliphatic and/or cycloaliphatic diisocyanates may be used as the diisocyanate component. Suitable aliphatic diisocyanates include, for example, those having 2 to 12 carbon atoms in the aliphatic radical, for example, ethylene diisocyanate, propylene diisocyanate, tetramethylene diisocyanate, hexamethylene diisocyanate, 2,2,4-trimethylhexamethylene diisocyanate and the like.

Suitable cycloaliphatic diisocyanates include, for example, 1,4-diisocyanatecyclohexane, dicyclohexylmethane-4,4'-diisocyanate (a.k.a. bis-cyclohexylmethylene diisocyanate), isophorone diisocyanate and the like.

It is preferred to react the diisocyanate in equivalent excess with the polyether diol or diols, in order that isocyanate terminated polyurethane oligomers are produced. The molar ratio of diol component to diisocyanate component is preferably between about 1.0:1.08 and 1.0:1.5, and more preferably between about 1.0:1.12 and 1.0:1.3. The number average molecular weights of the polyurethane oligomers are preferably between about 6,000 and 30,000, and more preferably between about 8,000 and 25,000, and most preferably between about 12,000 and 20,000.

Preferably, the reaction between the diol and the diisocyanate is achieved by contacting the reactants in the presence of a catalyst, preferably dibutyltin dilaurate or other such alkyltin catalyst, at an effective concentration, preferably from about 10 to about 20 ppm. The reaction temperature should be about 60 C., at which temperature the reaction time will be approximately 1.5 hours.

After reacting the polyether diol or diols with an excess of diisocyanate, to give an isocyanate-terminated polyurethane oligomer, the oligomer is reacted with a hydroxyacrylate or hydroxymethacrylate to introduce ethylenic unsaturation into the oligomer and provide the polyurethane prepolymer. Suitable hydroxyacrylates or hydroxy methacrylates include, without limitation, 2-hydroxypropyl (meth)acrylate, polypropylene glycol monomethacrylate, polypropylene glycol monoacrylate, or acrylated caprolactone oligomers. Of these, polypropylene glycol monomethacrylate and acrylated caprolactone oligomer are preferred for producing soft photopolymers necessary for printing on corrugated board or other cellulosic substrate having an irregular surface.

The second component of the photosensitive resin composition of the invention is a monomer having at least one acrylate group, also known as a reactive monomer, or simply a monomer. The reactive monomer of the instant invention may be any commonly available material having one or more photopolymerizable functional groups. A preferred reactive monomer is a mono- or poly-acrylate or methacrylate compound, including esters thereof. The designation (meth)acrylate will be used herein to simultaneously refer to one or both of methacrylates and acrylates.

The use of a compound having two or more ethylenically unsaturated groups in the monomer increases the hardness of the printing plate. Therefore, the amount of such compounds to be used should be controlled so that a printing plate having the desired hardness is obtained. For this reason, it is preferred that the reactive monomer be a mixture of a mono-(meth)acrylate ester and a poly(meth)acrylate ester.

Exemplary reactive monomers are the esters of acrylic acid and/or methacrylic acid with monohydric or polyhydric alcohols, and include, for example and without limitation, butyl (meth)acrylate, 2-ethylhexyl (meth)acrylate, isodecyl (meth)acrylate, lauryl (meth)acrylate, phenoethoxy (meth)acrylate, ethylene glycol di(meth)acrylate, 2-hydroxyethyl (meth)acrylate, hexane-1,6-diol di(meth)acrylate, 1,1,1-trimethylolpropane tri(meth)acrylate, di, tri, and tetraethylene glycol di(meth)acrylate, tripropylene glycol di(meth)acrylate, pentaerythritol tetra(meth)acrylate, propoxylated trimethylolpropane mono- di- and tri-(meth)acrylate, ethoxylated trimethylolpropane tri(meth)acrylate, and oligomeric polybutadienes with (meth)acrylic acid, i.e., oligomeric polybutadienes possessing activated, photopolymerizable olefinic double bonds.

Preferred monomers are laurylmethacrylate, polypropyleneglycol monomethacrylate, trimethylolpropane trimethacrylate and tetraethyleneglycol dimethacrylate.

The proportion of reactive monomer in the photosensitive resin formulation of the invention is dictated at least in part by the desired viscosity of the resulting liquid photosensitive resin. The greater the amount of monomer incorporated into the photosensitive resin, the lower is the resultant viscosity of the resin, for a given molecular weight of polyurethane prepolymer. The viscosity of the photosensitive resin is preferably between 10,000 cps and 100,000 cps, and more preferably between 20,000 cps and 50,000 cps. Most preferably, it is from about 25,000 cps to about 40,000 cps. The amount of unsaturated reactive monomer required for a given molecular weight polyurethane prepolymer to achieve a given viscosity for the photosensitive resin can be readily determined by one skilled in the art without undue experimentation.

Typically, the reactive monomer is present in from about 10 to about 35 weight percent of the photopolymerizable mixture, and more preferably in from about 15 to about 30 weight percent of the mixture.

The third component of the photosensitive resin composition of the invention is a photopolymerization initiator. There is no particular limitation with respect to the type of photopolymerization initiator to be used in the present invention. Therefore, any commonly used photopolymerization initiator customarily used in photosensitive resin compositions may be used.

As the photopolymerization initiator used in the present invention, use may be made of one or more than one of acenaphthenequinone, acylphosphincoxide, a-aminoacetophenone, benzanthraquinone, benzoin methyl ether, benzoin isopropyl ether, benzoin n-butyl ether, benzoin isobutyl ether, benzophenone, benzyldimethylketal, benzophenone, benzil dimethyl acetal, benzil 1-methyl 1-ethyl acetal, 2,2-diethoxy-2-phenylacetophenone, 2,2-diethoxyacetophenone, 2-dimethoxybenzoyldiphenylphosphine oxide, 2,2-dimethoxy-2-phenylacetophenone, i.e., Irgacure®651 (Ciba-Geigy), 4,4'-bis(dimethylamino)benzophenone, 2-ethylanthraquinone, ethyl 2,4,6-trimethylbenzoylphenyl phosphinate, hydroxyacetophenone, 2-hydroxy-2-methylpropiophenone, 2-hydroxy-2methyl-4'-isopropylisopropiophenone, 1-hydroxycyclohexyl phenyl ketone, 4'-morpholinodeoxybenzoin, 4-morpholinobenzophenone, alpha-phenylbutyrophenone, 2,4,6-trimethylbenzoyldiphenylphosphine oxide, 4,4'-bis (dimethylamino)-benzophenone.

A photoinitiator can be used alone or as a mixture with one another or in combination with coinitiators, e.g., ethylanthraquinone with 4,4'-bis(dimethylamino)benzophenone, benzoin methyl ether with triphenylphosphine, benzil dimethylketal with benzophenone, diacylphosphine oxides with tertiary amines or acyldiarylphosphine oxides with benzil dimethyl acetal.

The amount of the photopolymerization initiator can be any effective concentration which will allow the formation of a floor layer to the flexographic printing plate via a back exposure of a reasonable length of time and the formation of the relief image with the required image resolution. This time is related to the type of image being formed, as well as the thickness of the desired flexographic printing plate. The effective amount of photopolymerization initiator is dependent on the type of initiator chosen.

A concentration range of 0.1–10 wt % photoinitiator is suggested. When the amount of photoinitiator is less than 0.1%, the ultraviolet setting density is lowered and the physical properties of the photopolymer plate are extremely diminished. When the photoinitiator amount exceeds 10 wt %, no beneficial effect is observed for any property, and the cost of the formulation becomes commercially undesirable.

For 2,2-dimethoxy-2-phenylacetophenone, the photoinitiator(s) is used in the photopolymerizable mixtures in an amount of from about 0.1% to about 5%, preferably about 0.1% to about 1.5%, and more preferably from about 0.15% to about 0.5%.

To protect the photopolymerizable mixtures from decomposition by oxidation and thermal oxidation by atmospheric oxygen, effective amounts of conventional antioxidants may be added to the mixture. Exemplary antioxidants are, for example, sterically hindered monophenols, such as 2,6-di-tert-butyl-p-cresol (BHT), alkylated thiobisphenols and alkylidenebisphenols, such as 2,2-methylenebis-(4-methyl-6-tert-butylphenol) or 2,2-bis(1-hydroxy-4-methyl-6-tert-butylphenyl)sulfide, hydroxybenzyls, such as 1,3,5-trimethyl-2,4,6-tris-(3,5-di-tert-butyl-4-hydroxybenzyl)benzene, triazines, such 2-(4-hydroxy-3,5-tertbutylanilino)-4,6-bis-(n-octylthio)-1,3,5-triazine, polymerized trimethyldihydroquinone, dibutylzinc dithiocarbamate, dilauryl thiodipropionate and phosphites, such as tris (nonylphenyl) phosphite. BHT is a preferred antioxidant.

Suitable slip additives can be added to the photosensitive resin to reduce the surface tack of the printing plates as is disclosed in, for example, U.S. Pat. No. 4,716,094 the teachings of which are incorporated herein in their entirety.

The photosensitive resins of this invention can be cured by exposure to actinic radiation followed by removal of unpolymerized resins by washing with an aqueous solution to provide flexographic printing plates which print cleanly and do not pick up, or which readily release, paper dust and fibers and dried ink. This enables the inventive flexographic printing plate to be used for printing on corrugated boards or paper bags or containers made of Kraft paper without requiring frequent cleaning of the printing plate due to the accumulation of dried paper dust and fibers as would be required with printing plates known in the art. Of course, the printing plates of the invention also print well on other cellulosic sheets having less paper dust than typically found on corrugated board.

The preparation of the printing plate from the photosensitive resin of the instant invention can be accomplished by any customary method used with other photosensitive resin. That is, the photosensitive resin may be provided as a layer of uniform thickness between a substrate backing sheet and a cover sheet facing a photographic negative and subjecting the layer to a back exposure and image exposure with actinic radiation, followed by development of the plate.

The substrate backing sheet, also known as the support, can be any flexible material which is conventionally used with photosensitive elements used to prepare flexographic printing plates. Examples of suitable substrate materials include polymeric films such as those formed by addition polymers and linear condensation polymers, transparent foams and fabrics. A preferred substrate is a polyester film; particularly preferred is polyethylene terephthalate. The substrate typically has a thickness from 2 to 10 mils (0.0051 to 0.025 cm), with a preferred thickness of 4 to 7 mils (0.010 to 0.018 cm).

The thickness of a printing plate for printing on a corrugated board is typically from about 0.067 inches to about 0.250 inches. The thickness of the relief layer of such printing plates is typically from about 0.025 inches to about 0.125 inches, depending on the thickness of the printing plate. A photosensitive resin with a viscosity as described above minimizes the flow that might occur during the formation of a layer of said thickness that would cause undesired variations in the thickness of the photosensitive resin layer, but still makes for easy handling and transferring of the photosensitive resin during manufacturing. Flexographic printing plates for printing on substrates other than corrugated boards may require plate thicknesses other than those above.

Examples of suitable sources of actinic radiation are sunlight and commercial UV fluorescent tubes, medium pressure, high pressure and low pressure mercury lamps, superactinic fluorescent tubes, pulsed xenon lamps, lamps doped with metal iodides and carbon arc lamps. Preferably, the photopolymer plates used in the present invention are cured with ultraviolet rays having a wavelength of 150–500 nm, especially 300–400 nm, which are generated by a low-pressure mercury lamp, high-pressure mercury lamp, carbon arc lamp, ultraviolet fluorescent lamp, chemical lamp, xenon lamp, or zirconium lamp.

There are several types of apparatus in practical use for the development of photopolymer plates. One forms the relief by blowing off the unexposed part by means of compressed air. Another forms the relief by spraying the washout solution under pressure onto the plate. Yet another forms the relief by rubbing a brush against the plate fixed to a flat surface or cylinder, thereby dissolving the unexposed part in the solution. It is preferred that the photopolymer plate, after curing by exposure to one of the above-mentioned light source, be developed with a developer, also known as a washout solution, which removes the unexposed non-image part. This process forms a relief image on the photopolymer plate. The unexposed part which has been removed by the washout solution remains in the form of emulsion or suspension in the washout solution in the washout bath.

It is preferred to use an aqueous developer. The developer is most desirably water which may optionally contain an alkaline compound (such as sodium hydroxide and sodium carbonate), surfactant, and water-soluble organic solvent. The addition of a surfactant is desirable for the photopolymer to readily disperse into water and to remain dispersed in water. Preferred surfactants are sodium alkyl-naphthalenesulfonate and sodium alkylbenzenesulfonate. Other examples of the surfactant include anionic surfactants containing a carboxylate, sulfate-ester, sulfonate, or phosphate-ester; nonionic surfactants such as polyethylene glycol derivative, polyhydric alcohol derivative, and sorbitan derivative; cationic surfactants containing a primary, secondary or tertiary amine salt, or a quaternary ammonium salt; and amphoteric surfactants containing an amino acid hydrophilic group or a betaine hydrophilic group. The washout solution should be used at 25–50 C., preferably 30–40 C. The concentration of the surfactant in water is not limited, but is generally in the range of about 0.5% to about 4%. While the plate is most often developed by spray washing with the aqueous developer solution, other techniques, including those mentioned above, may be used as well.

After developing, photopolymer flexographic printing plates generally retain at least some degree of surface tackiness, particularly on the "shoulders" of the relief and other non-image areas. Excessive surface tackiness is undesirable in a printing relief. Several methods have been developed to reduce surface tack, and may be applied to the printing plates of the invention. For example, it is well known in the art that exposure to short wavelength irradiation, such as is known from U.S. Pat. No. 4,202,696, the teachings of which are incorporated herein by reference in their entirety, can reduce surface tack by postcuring the plate with short wavelength actinic radiation after exposure to certain carbonyl compounds including benzophenone. Likewise, slip additives may be added to photosensitive resin as described in U.S. Pat. No. 4,716,094, the teachings of which are incorporated herein by reference in their entirety, to reduce tack of the resulting printing plates.

The printing plate according to the present invention will have a Shore A hardness of 25 to 60 at 20 C. Most preferably, the printing plate has a Shore A hardness of from 30 to 45.

The printing plate of the present invention should also have an impact resilience at 23 C. of 45% or more as measured as described below. If the impact resilience is outside the above-mentioned range, the capability of the printing plate to release the paper dust or the like, which has adhered to the surface of the plate is diminished. Thus, it would become necessary to interrupt the printing operation in order to clean the printing plate.

The following examples are for illustrative purposes only. In each of the following examples printing plate hardness is measured with a Shore A durometer, available from Shore Instrument and Manufacturing Co., according to ASTM method D-2240 Printing plate resiliency is reported as rebound resilience, as measured according to a modification of ASTM method D2632 wherein the sample thickness is 0.250 inches, using a Bayshore resiliometer operated at 23 C. The Bayshore resiliometer may be obtained from Shore Instrument and Manufacturing, or from Precision Scientific Co.

Each of the photopolymerizable compositions of the following examples was formed into a photopolymer printing plate according to the following procedure. Using a Merigraph® type 3048 exposure unit available from MacDermid, Incorporated, Wilmington, Del., a 0.125" thick layer of the photosensitive resin composition was formed as a layer between an adhesive coated polyester backing sheet and a cover sheet of polypropylene film, which separated the photo resin from a photographic negative. The photopolymer was subjected to a back-side exposure of 2:30, followed by an imaging exposure through the negative for 6:00. After the exposure, the cover sheet was removed and the uncured resin was removed by spray washing with an aqueous solution containing 2% by weight Merigraph® washout detergent W6410L available from MacDermid, Incorporated, Wilmington, Del. and 2% by weight sodium triphosphate at 35–40 C. for ten minutes to obtain a relief plate. Then the plate was immersed in an aqueous solution of sodium bisulfite and subjected to postexposure by actinic radiation having a minimum intensity of 8 Mw/cm$^2$ to completely cure the relief portion of the plate. The plate was then dried for 30 minutes at 40 C. Further, the plate was subjected to a dry post-exposure step under germicidal lights for 10 minutes. The Shore A hardness and Bayshore resilience of each plate was measured as described above. Photosensitive resin compositions were cured for tensile strength and elongation measurements by casting a 0.040" thick layer of the photosensitive resin composition between a 0.004" uncoated polyester sheet and a polypropylene film. The photopolymer was subjected to a backside exposure of 30 seconds followed by a frontside exposure of 400 seconds. The polyester and polypropylene films were peeled away and the samples were die-cut for tensile testing according to ASTM method D-412. The photopolymerizable composition and the results of the testing is reported for each example.

EXAMPLE 1

1349 g (0.429 moles) of Acclaim 3205 (polypropylene oxide/ethylene oxide diol, M.W.=3000 and unsaturation= 0.003 meq/gm, available from Arco Chemical Co.) 90 g (0.515 moles) of Toluene Diisocyanate (TDI) and 0.10 grams of dibutyltin dilaurate (DBTDL) catalyst were charged into a 2 liter resin kettle equipped with a nitrogen purge, air stirrer and thermocouple. After an initial exothermic reaction, the reaction mixture was kept at 60° C. for 2 hours until the isocyanate concentration had reached 0.40% by weight, as determined by titration with di-n-butylamine. Then a mixture of 160.0 grams (0.421 moles) of polypropyleneglycol monomethacrylate (MW 380 g/mole), 1.6 g BHT and 0.06 g DBTDL was then added to the reaction mixture, and the contents were maintained at 60° C. for 2 additional hours until titration indicated no remaining isocyanate.

Composition A

To 70.8 grams of the foregoing resulting urethane prepolymer were added 14.5 grams polypropyleneglycol monomethacrylate, 7.3 grams lauryl methacrylate, 1.4 grams trimethylolpropane trimethacrylate, 1.2 grams tetraethyleneglycol dimethacrylate, 1.5 grams of N,N-diethylaminoethyl methacrylate, 0.3 grams methyldiethanol amine, 2 grams myristic acid, 0.3 grams Irgacure 651, 0.1 grams BHT and 0.6 grams benzophenone. The resulting mixture was stirred for 2 hours to obtain a photosensitive resin composition. The resin was made into a photopolymer printing plate, and test sheets, as above and was found to have a bayshore resilience of 49%, a tensile strength of 870 psi, elongation of 327% and a Shore A hardness of 32. Upon storage of such test sheets for 28 days in a chamber maintained at 50° C. and 90% relative humidity no change in properties was observed.

Composition B

To 70.0 grams of the foregoing resulting urethane prepolymer were added 14.5 grams polypropyleneglycol monomethacrylate, 9.5 grams lauryl methacrylate, 1.0 grams trimethylolpropane trimethacrylate, 1.0 grams tetraethyleneglycol dimethacrylate, 1.5 grams of N,N-diethylaminoethyl methacrylate, 2 grams myristic acid, 0.4 grams Irgacure 651 and 0.1 grams BHT. The resulting mixture was stirred for 2 hours to obtain a photosensitive resin composition. The resin was made into a photopolymer printing plate, and test sheets, as above and was found to have a bayshore resilience of 45%, a tensile strength of 963 psi, elongation of 358% and a Shore A hardness of 34. The thus prepared printing plates were used to print 33,000 sheets of corrugated board. Ink transfer, coverage and color density were excellent, and any paper dust or fibers which became deposited on the plate readily released after several additional sheets were produced. It was not necessary to stop the press to clean the plates at all during the operation.

EXAMPLE 2

1305 g (0.327) moles of Acclaim 2220 (Ethylene oxide end-capped polypropylene oxide diol, mw.=2200, unsaturation=0.005 meq/gm, available from Arco Chemical Co.), 69 g (0.395 moles) of TDI and 0.10 grams of dibutyltin dilaurate (DBTDL) catalyst were charged into a 2 liter resin kettle equipped with a nitrogen purge, air stirrer and thermocouple. After an initial exothermic reaction, the reaction mixture was kept at 60° C. for 2 hours until the isocyanate concentration had reached 0.40% by weight, as determined by titration with di-n-butylamine. Then a mixture of 224.0 grams (0.421 moles) of polypropyleneglycol monomethacrylate (MW 380 g/mole), 1.6 g BHT and 0.06 g DBTDL was then added to the reaction mixture, and the contents were maintained at 60° C. for 2 additional hours until titration indicated no remaining isocyanate.

To 70.7 grams of the resulting urethane prepolymer were added 14.5 grams polypropyleneglycol monomethacrylate, 7.3 grams lauryl methacrylate, 1.5 grams trimethylolpropane trimethacrylate, 1.2 grams tetraethyleneglycol dimethacrylate, 1.5 grams of N,N-diethylaminoethyl methacrylate, 0.3 grams methyldiethanol amine, 2 grams myristic acid, 0.3 grams Irgacure 651, 0.1 grams BHT and 0.6 grams benzophenone. The resulting mixture was stirred for 2 hours to obtain a photosensitive resin composition. The resin was made into a photopolymer printing plate, or test sheets, as above and was found to have a bayshore resilience of 46%, a tensile strength of 740 psi, elongation of 334% and a Shore A hardness of 26.

The thus prepared printing plates were used to print 33,000 sheets of corrugated board. Ink transfer, coverage and color density were excellent, and any paper dust or fibers which became deposited on the plate readily released after several additional sheets were produced. It was not necessary to stop the press to clean the plates at all during the operation.

Comparative Example 634 g (0.316 moles) of Poly G 55-53 (Ethylene oxide end capped polypropylene oxide diol, m.w.=2000, unsaturation=0.023 meq/gm, available from Olin Corp.), 60.5 g (0.347 moles) of TDI and 0.03 grams of DBTDL were charged into a 2 liter resin kettle equipped with a nitrogen purge, air stirrer and thermocouple. After an initial exothermic reaction, the reaction mixture was kept at 60° C. for 2 hours until the isocyanate concentration had reached 0.540% by weight, as determined by titration with di-n-butylamine. Then a mixture of 106.0 grams (0.0.279 moles) of polypropyleneglycol monomethacrylate (MW 380 g/mole), 1.6 g BHT and 0.06 g DBTDL was then added to the reaction mixture, and the contents were maintained at 60° C. for 2 additional hours until titration indicated no remaining isocyanate.

To 69.6 grams of the resulting urethane prepolymer were added 15 grams polypropyleneglycol monomethacrylate, 8 grams lauryl methacrylate, 1.0 grams trimethylolpropane trimethacrylate, 1.6 grams tetraethyleneglycol dimethacrylate, 1.5 grams of N,N-diethylaminoethyl methacrylate, 2.3 grams of myristic acid, 0.3 grams Irgacure 651, 0.1 grams BHT and 0.6 grams benzophenone. The resulting mixture was stirred for 2 hours to obtain a photosensitive resin composition. The resin was made into a photopolymer printing plate, or test sheets, as above and was found to have a bayshore resilience of 34%, a tensile strength of 720 psi, elongation of 349% and a Shore A hardness of 28.

The thus prepared printing plates were used to print 33,000 sheets of corrugated board. Ink transfer, coverage and color density were poorer than in Examples 1 and 2. It was necessary to stop the press several times during the run to clean dried ink, paper dust and fibers from the printing plate.

I claim:

1. A photopolymer composition comprising:
   a. a polyurethane prepolymer prepared by reacting at least one diisocyanate with at least one polyether diol having olefin unsaturation equal to or less than 0.01 meq/gm to form an oligomer and further reacting the oligomer with at least one hydroxy functionalized (meth) acrylate to form the polyurethane prepolymer;
   b. at least one monomer; and
   c. at least one photoinitiator;
   wherein at least one polyether diol having olefin unsaturation equal to or less than 0.01 meq/gm is a copolymer selected from the group consisting of random ethylene oxide-propylene oxide copolymers, ethylene oxide-propylene oxide segmented copolymers, and mixtures thereof.

2. A photopolymer composition according to claim 1 wherein at least one polyether diol has olefin unsaturation equal to or less than 0.007 meq/gm.

3. A photopolymer composition according to claim 1 wherein at least one polyether diol having olefin unsaturation equal to or less then 0.01 meq/gm is a segmented ethylene oxide-propylene oxide copolymer with a middle segment comprised of a random copolymer with less than 25 percent ethylene oxide and end segments comprised of random ethylene oxide-propylene oxide copolymers with greater than 25 percent ethylene oxide.

4. A photopolymer composition according to claim 3 wherein at least one polyether diol has olefin unsaturation equal to or less than 0.007 meq/gm.

* * * * *